US006400207B1

United States Patent
Ivanov et al.

(10) Patent No.: US 6,400,207 B1
(45) Date of Patent: Jun. 4, 2002

(54) QUICK TURN-ON DISABLE/ENABLE BIAS CONTROL CIRCUIT FOR HIGH SPEED CMOS OPAMP

(75) Inventors: Vadim V. Ivanov; Shilong Zhang, both of Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/825,401

(22) Filed: Apr. 3, 2001

(51) Int. Cl.[7] ................................. H03L 7/00
(52) U.S. Cl. .................. 327/374; 327/376; 327/377; 323/901
(58) Field of Search ................. 327/374, 376, 327/377, 437; 323/315, 901

(56) References Cited

U.S. PATENT DOCUMENTS

| | | | | |
|---|---|---|---|---|
| 5,065,055 A | * | 11/1991 | Reed | 327/52 |
| 5,578,956 A | * | 11/1996 | Rossi et al. | 327/309 |
| 6,057,721 A | | 5/2000 | Nolan et al. | 327/143 |
| 6,118,263 A | * | 9/2000 | O'Neill et al. | 323/315 |
| 6,177,825 B1 | * | 1/2001 | Nayebi et al. | 327/374 |

* cited by examiner

Primary Examiner—Dinh T. Le
(74) Attorney, Agent, or Firm—W. Daniels Swayze, Jr.; W. James Brady; Frederick J. Telecky, Jr.

(57) ABSTRACT

Bias circuitry of an electronic circuit is disabled by interrupting a compensated feedback loop in a bias control circuit that, when enabled, produces a predetermined bias voltage ($V_{BIAS+}$) applied to the bias circuitry. A trickle charging current is conducted into a compensation capacitor of the feedback loop while the bias circuitry is disabled, to charge the compensation capacitor to a predetermined threshold voltage which causes the feedback loop and bias control circuit, when enabled, to produce the predetermined voltage needed by the bias circuitry to bias the CMOS operational amplifier for normal operation. Next, the feedback loop is enabled. Since the compensation capacitor is already precharged to the predetermined voltage, the bias circuitry of the CMOS operational amplifier is very quickly enabled from the disabled condition.

21 Claims, 3 Drawing Sheets

QUICK TURN-ON DISABLE/ENABLE BIAS CONTROL CIRCUIT FOR HIGH SPEED CMOS OPAMP

BACKGROUND OF THE INVENTION

The present invention relates generally to start-up circuits for integrated circuit applications. More particularly, the present invention relates to a quick turn-on disable/enable bias control circuit for use in conjunction with high speed CMOS amplifiers, particularly CMOS amplifiers used in high speed video multiplexing applications.

In certain types of electrical circuits, and particularly in high speed amplifier circuits, there are internal nodes that need to be quickly charged to a predetermined voltage level. To minimize power consumption, portions of the circuitry are designed to be disabled so as to be in a quiescent, low-power state until fully functional circuit operation is needed.

In conventional application of the power supply voltage to prior amplifier circuits, a slow ramp voltage is applied to the amplifier circuit and its associated bias circuitry. The slow ramp voltage often is too slow to provide adequately rapid operation of the internal bias circuitry of the amplifier. To speed the recovery of the amplifier from an off, i.e., disabled, condition, quick turn-on bias circuits have been provided, for example as disclosed in U.S. Pat. No. 5,742,155 to Susack et al. (April, 1998) and U.S. Pat. No. 6,057,721 to Nolan et al. (May, 2000). The bias voltage provided by the by Susack et al. and circuit includes an overdrive capability that initially drives the output voltage of a high gain amplifier to a much higher level than is required in order to accelerate a bias voltage node charging process, and a feedback loop operates to gradually return the bias voltage to the level needed by the circuit. The Nolan et al. patent discloses a high gain reference circuit and a current generator coupled together to initialize the high gain reference circuit to an active state. A high current is injected during start-up so as to rapidly charge certain nodes in the circuit, and the feedback loop gradually returns the current to a proper level. The large applied voltages, the high start-up currents, the relatively slow start-up times, the high amounts of power dissipation, and the long settling times of the quick turn on bias circuits disclosed in the above references make them unsuitable for use in some applications, for example in high speed CMOS operational amplifiers used in video multiplexing applications.

SUMMARY OF THE INVENTION

It is an object of the invention to provide a bias control circuit that is capable of being disabled to a shutdown condition and being rapidly enabled from the shutdown condition to immediately provide a needed control bias voltage.

It is another object of the invention to provide a bias control circuit that is capable of being rapidly disabled to a shutdown condition and being rapidly enabled from the shutdown condition to immediately produce a control bias voltage applied to bias circuitry to produce a bias current.

It is another object of the invention to provide a bias control circuit which is capable of being rapidly enabled from a shutdown condition to immediately produce a needed bias current, and which is particularly useful in rapidly biasing up a high speed CMOS amplifier or other electronic circuit from a disabled, low-power condition.

It is another object of the invention to provide a bias control circuit which is capable of being rapidly enabled from a shutdown condition to immediately provide a needed bias current, and which is particularly useful in conjunction with high speed CMOS amplifiers, especially in CMOS operational amplifiers used in high speed video multiplexing applications.

It is another object of the invention to provide a bias control circuit which is capable of being rapidly enabled from a shutdown condition to immediately provide a needed bias current, and which is particularly useful in conjunction with high speed CMOS amplifiers utilized in fast voltage regulators.

It is yet another object of the invention to provide a quick turn-on bias control circuit which does not require a long settling time after predetermined bias levels are achieved.

Briefly described, and in accordance with one embodiment thereof, the invention provides a disable/enable bias control circuit (1) that disables bias circuitry (M22) of an electronic circuit by interrupting a compensated feedback loop in a bias control circuit. The feedback loop, when enabled, causes the disable/enable bias control circuit to produce a predetermined bias voltage ($V_{BIAS+}$) which is applied to the bias circuitry (M22). A trickle charging current is conducted into a compensation capacitor of the feedback loop while the bias circuitry is disabled, in order to charge the compensation capacitor to a predetermined threshold voltage which causes the feedback loop and bias control circuit (1), when they are enabled, to produce the predetermined voltage needed by the bias circuitry to bias the electronic circuit (18) for normal operation. The feedback loop then is enabled, and the compensation capacitor is already precharged to the predetermined voltage, the electronic circuit is very quickly enabled from the disabled condition.

In one embodiment, the disable/enable bias control circuit (1) includes a reference voltage circuit (2) having an internal feedback loop and a compensation capacitor (C0) of the feedback loop, wherein the voltage reference circuit is operative, when enabled, to produce a bias voltage having a predetermined value ($V_{BIAS+}$). A shutdown circuit (M11 & M3) is coupled to the reference voltage circuit and is operative in response to a first level of a control signal ($V_{SHUTDOWN}$) to disable the reference voltage circuit and also to disable the feedback loop. A trickle charging circuit (3) is coupled to a terminal of the compensation capacitor and is responsive to the first level of the control signal ($V_{SHUTDOWN}$) to produce a trickle charging current into the compensation capacitor to maintain a voltage across the compensation capacitor at a predetermined value which enables the feedback loop to very rapidly cause the reference voltage circuit to produce the predetermined value ($V_{BIAS+}$) of the bias voltage. A bias circuit transistor (M22) of a bias circuit controlled by the disable/enable bias control circuit (1) includes a source coupled to a supply voltage conductor ($V_{DD}$), a gate coupled to receive the predetermined value ($V_{BIAS+}$) of the bias voltage, and a drain supplying a bias current $I_{BIAS+}$ to an electronic circuit (18). The disable/enable bias control circuit includes a shutdown control circuit (15) which produces the control signal ($V_{SHUTDOWN}$). The shutdown control circuit (15) includes an input terminal (80) and an output that produces the first level (LOW) of the shutdown signal in response to an external signal applied to the input terminal. The trickle charging circuit (2) includes a very high resistance circuit coupled between the supply voltage conductor and a threshold circuit (M26,Q13) to establish a trickle control current, a trickle current output transistor (M25) having a gate coupled to the threshold circuit, and a source coupled to the terminal of the compensation capacitor (C0). A trickle current produced by the trickle circuit output transistor (M25) precharges the compensation capacitor to a voltage determined by the threshold circuit.

DETAILED DESCRIPTION OF THE PREFERRED EMBODIMENTS

Figure 1:
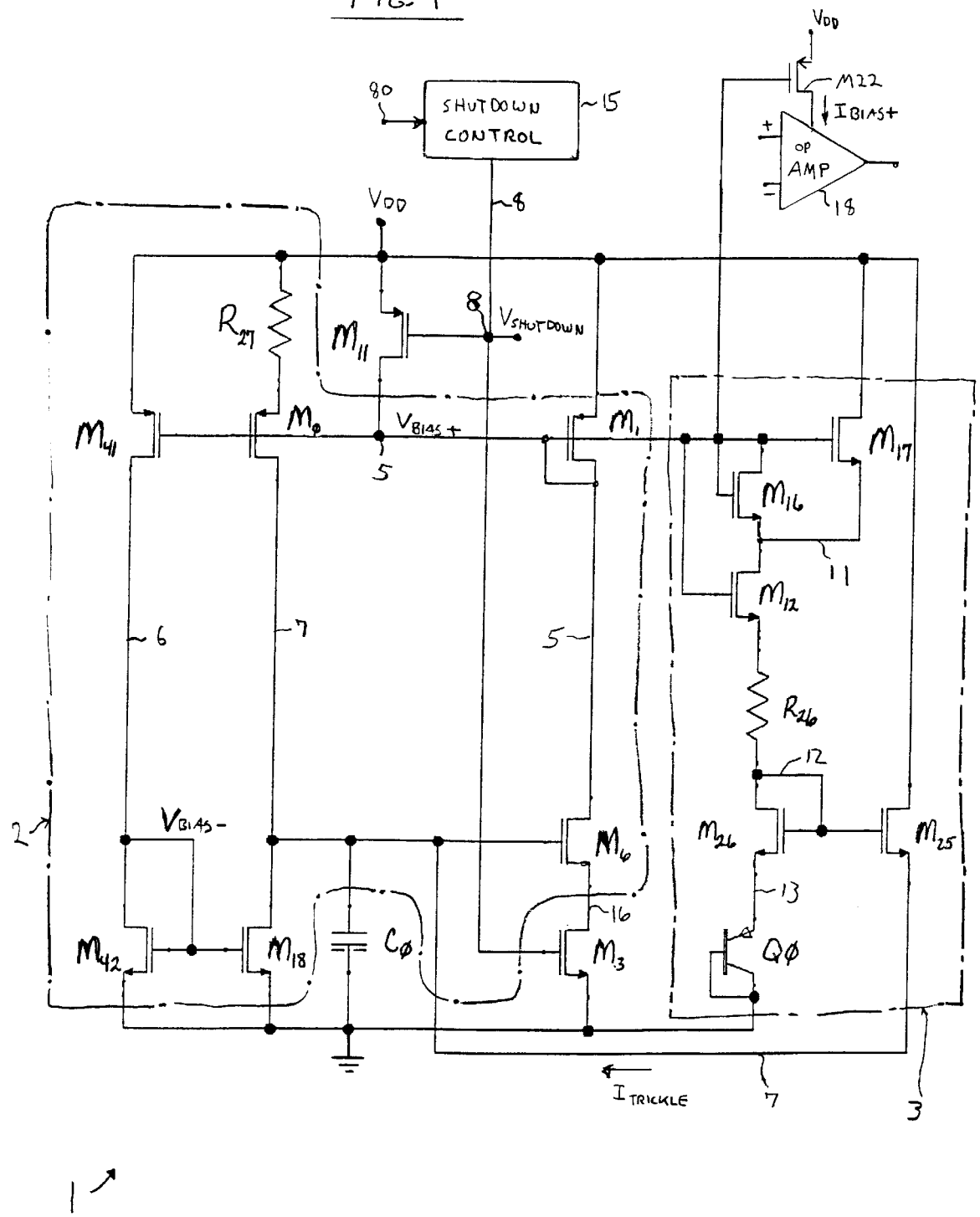
FIG. 1 is a schematic diagram of a preferred embodiment of the invention.

Referring to FIG. 1, disable/enable bias control circuit 1 includes a bias core circuit 2 and a fast start-up circuit 3. The bias core circuit 2 includes a P-channel transistor M41 having its gate connected to conductor 5, its source connected to $V_{DD}$, and its drain connected by conductor 6 to the drain and gate of an N-channel transistor M42. The source of transistor M42 is connected to ground. Bias core circuit 2 also includes an N-channel transistor M18 having its source connected to ground, its gate connected to conductor 6, and its drain connected to conductor 7. Conductor 7 is connected to the drain of a P-channel transistor M0 having its gate connected to conductor 5 and its source connected to one terminal of a resistor R27, the other terminal of which is connected to $V_{DD}$. Conductor 7 also is connected to one terminal of a compensation capacitor C0 having its other terminal connected to ground. Conductor 7 also is connected to the gate of an N-channel feedback control transistor M6 having its source connected to conductor 16 and its drain connected to conductor 5. Conductor 5 also is connected to the gate and drain of a P-channel transistor M1 having its source connected to $V_{DD}$. Transistors M42 and M18 form an N-channel current mirror which is controlled by a P-channel current mirror formed by transistors M1, M0, and M41.

Conductor 5 is connected to the drain of a P-channel bias core disable transistor M11 which is located outside of bias core circuit 2. The source of transistor M11 is connected to $V_{DD}$, and its gate is connected by conductor 8 to receive an external signal $V_{SHUTDOWN}$ produced by an external shutdown control circuit 15 in response to an external control signal applied to an external input 80 thereof. $V_{SHUTDOWN}$ also is applied to the gate of a feedback loop disable transistor M3 having its drain connected by conductor 16 to the source of feedback control transistor M6. The source of feedback loop disable transistor M3 is connected to ground.

A voltage $V_{BIAS+}$ is produced on conductor 5 by bias core circuit 2 when it is active. $V_{BIAS+}$ is one of the outputs of disable/enable bias control circuit 1, and typically is applied to the gates of one or more P-channel current mirror transistors of bias circuitry associated with an electronic circuit, such as CMOS amplifier 18. For example, in FIG. 1, conductor 5 is connected to the gate of a P-channel transistor M22 having its source connected to $V_{DD}$ and its drain connected to supply a bias current $I_{BIAS+}$ to CMOS operational amplifier 18, which typically would be included on the same integrated circuit chip as disable/enable bias control circuit 1. Similarly, the voltage on conductor 6 is designated $V_{BIAS-}$, and constitutes another output of disable/enable bias control circuit 1. $V_{BIAS-}$ typically is applied to the gates of a plurality of N-channel current mirror transistors (not shown) of bias circuitry of electronic circuit 18.

Figure 2:
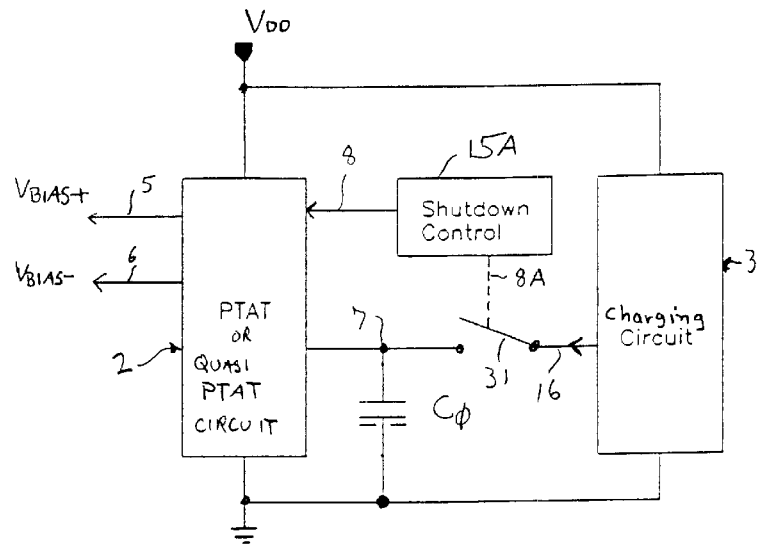
FIG. 2 is a generalized block diagram of the embodiment of FIG. 1.

Charging circuit 3 includes N-channel transistors M12, M16, M17, M25, M26, resistor R26, and a diode or diode-connected PNP transistor Q0. The gate and drain of transistor M16 are connected to conductor 5. The source of transistor M16 is connected by conductor 11 to the drain of transistor M12 and to the source of transistor M17. The gate of transistor M17 is connected to conductor 5 and its drain is connected to $V_{DD}$. The gate of transistor M12 is connected to conductor 5, and its source is connected to one terminal of resistor R26, the other terminal of which is connected by conductor 12 to the gate and drain of transistor M26 and to the gate of a trickle current output transistor M25. The source of transistor M26 is connected by conductor 13 to the emitter of diode-connected transistor Q0, the base and collector of which are connected to ground. The drain of transistor M25 is connected to $V_{DD}$, and its source is connected to conductor 7. The shutdown control circuit 15 ordinarily would simply be a buffer circuit or a Schmitt trigger circuit having its output connected to conductor 8 and its input connected to an external conductor 80 on which a user applies an external control signal to disable/enable bias control circuit FIG. 2 shows a generalized block diagram of the disable/enable bias control circuit 1 of FIG. 1, which typically includes a quasi-PTAT circuit 2 (hereinafter referred to simply as PTAT circuit 2) coupled between $V_{DD}$ and ground. PTAT circuit 2 produces a bias voltage $V_{BIAS+}$, on conductor 5, and typically produces another bias voltage $V_{BIAS-}$ on conductor 6. A shutdown control circuit 15A applies a control signal on conductor 8 to PTAT circuit 2, and also applies a signal 8A to control a switch 31 coupled by conductor 16 to the output of a charging circuit 3 and by conductor 7 to one terminal of a compensation capacitor C0 having its other terminal connected to ground. Charging circuit 3 is coupled between $V_{DD}$ and ground. PTAT circuit 2 includes bias core circuit 2 of FIG. 1. The shutdown control circuit 15A of FIG. 2 includes transistor M11 and shutdown control circuit 15 of FIG. 1. Charging circuit 3 of FIG. 2 includes charging circuit 3 of FIG. 1.

Figure 3:
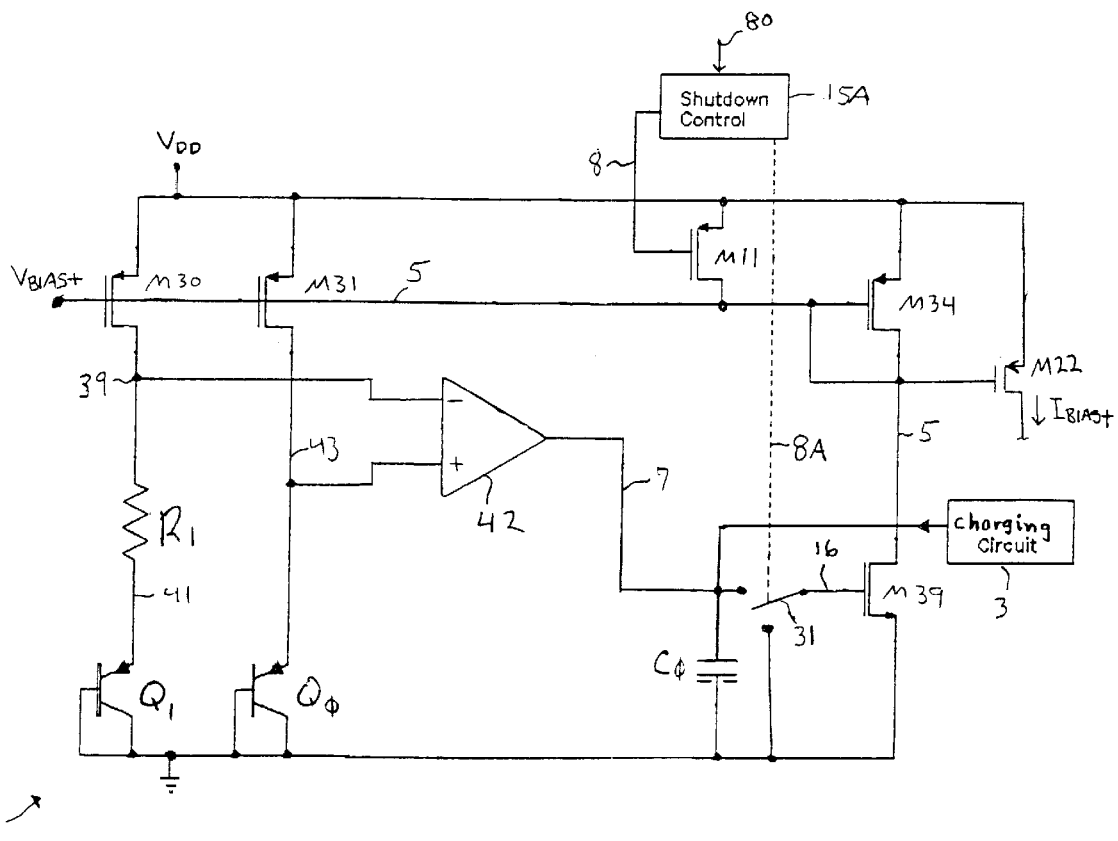
FIG. 3 is a schematic diagram of another embodiment of the invention.

Referring to FIG. 3, another quick enable disable/enable bias control circuit 40 of the present invention includes P-channel transistors M30, M31, M11, and M34, N-channel transistor M39, diode-connected PNP transistors Q0 and Q1, compensation capacitor C0, resistor R1, shutdown control circuit 15A, and charging circuit 3. The sources of transistors M30, M31, and M34 are connected to $V_{DD}$, and the gates thereof are connected to conductor 5. The source of transistor M11 is connected to $V_{DD}$, its gate is connected by conductor 8 to shutdown control circuit 15A, and its drain is connected to conductor 5. The reference voltage $V_{BIAS+}$ is produced on conductor 5 The drain of transistor M34 is connected to conductor 5, and also to the drain of transistor M39, the gate of which is connected to conductor 16 and the source of which is connected to ground. $V_{BIAS+}$ is applied to the gate of a P-channel bias transistor M22 having its source connected to $V_{DD}$, so a bias current $I_{BIAS+}$ is supplied from the drain of transistor M22 to an electronic circuit such as amplifier 18.

The drain of transistor M30 is connected by conductor 39 to the (−) input of an operational amplifier 42 and to one terminal of resistor R1, the other terminal of which is connected by conductor 41 to the emitter of diode-connected PNP transistor Q1. The base and collector of transistor Q1 are connected to ground. The drain of transistor M31 is connected by conductor 43 to the (+) input of amplifier 42 and to the emitter of diode-connected PNP transistor Q0, the base and collector of which are connected to ground. The output of amplifier 42 is connected by conductor 7 one terminal of compensation capacitor C0 and to the output of charging circuit 3. A switch 31 controlled by a signal 8A produced by shutdown control circuit 15A selectively couples conductor 16 to conductor 7 or to ground.

Figure 4:
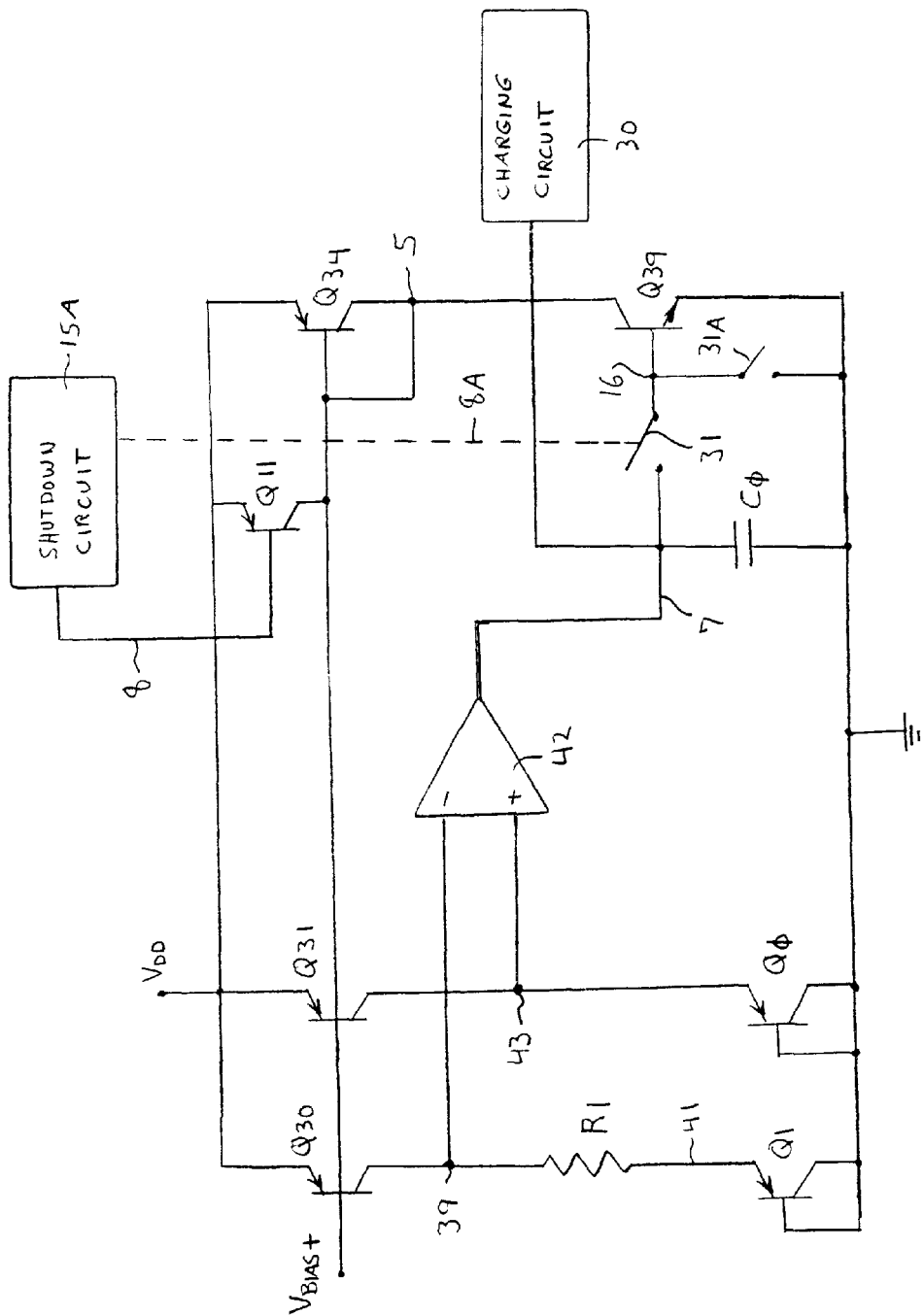
FIG. 4 is a schematic diagram of an embodiment of the invention implemented using bipolar transistors.

FIG. 4 shows an alternative implementation of the disable/enable bias control circuit of FIG. 3 except that the P-channel MOS transistors have been replaced by PNP transistors and the N-channel MOS transistors have been replaced by NPN transistors. In FIG. 4, the shutdown circuit 15A and charging circuit 3, and also the operational amplifier 18 and its bias circuitry M22 as shown in FIG. 1 also could be implemented using bipolar transistors rather than CMOS transistors.

The operation of quick enable boost circuit 1 of FIG. 1 is described next. If shutdown control circuit 15 determines that the CMOS amplifier and the bias circuitry in block 18 should be disabled so as to dissipate a minimum amount of power and also to provide a high impedance condition at the output of the CMOS amplifier, then shutdown control circuit 15 produces a low value of $V_{SHUTDOWN}$ on conductor 8. This turns on transistor M11 and turns off transistor M3. The on condition of transistor M11 pulls conductor 5 close to $V_{DD}$, which turns off transistors M0, M1, and M41. The high voltage on conductor 5 also turns on transistors M12, M16 and M17.

The off condition of transistors M0 and M41 causes transistors M18 and M42 to be off. Consequently, no current flows into compensation capacitor C0 from transistor M0 and no current is drawn out of compensation capacitor C0 by transistor M18. With transistor M3 off, both the negative feedback loop including transistors M6, M1, M0 and the positive feedback loop including transistors M6, M1, M41, M42, and M18 are disabled.

Transistor M17 is designed to have a very long channel length, so as to produce a drain and source current of only approximately 0.1 to 5 microamperes. Transistors M16 and M12 in combination perform the function of preventing a possible unstable condition in quasi PTAT circuit 2 by causing part of the "charging reference current" in transistor M26 to be supplied from transistor M16 and causing the sum of the currents in transistors M16 and M17 (approximately 0.1 to 5 microamperes) to flow through transistor M12 and resistor R26, and therefore through transistor M26 and diode-connected PNP transistor Q0.

Transistor M26 and diode-connected transistor Q0 function as a threshold or reference circuit which determines the voltage to which compensation capacitor C0 is to be charged by the subsequently described all charging current $I_{TRICKLE}$. Resistor R26 has a very high resistance which is added to the very high combined resistance of transistors M12, M16 and M17, so as to provide the several megohm resistance needed to produce the very low 1–2 microampere trickle charging current from $V_{DD}$, which typically is 5 volts.

This causes a trickle charging current $I_{TRICKLE}$ of approximately 1–2 microamperes to flow through transistor M25 and conductor 7 to maintain a charge in compensation capacitor C0 so as to maintain the voltage on conductor 7 approximately equal to the sum of the $V_{BE}$ voltage of transistor Q0 and the $V_{GS}$ voltage of transistor M26 minus the $V_{GS}$ voltage of transistor M25. (The trickle charging current through transistor M25 becomes so low as compensation capacitor C0 is charged up that the $V_{GS}$ voltage of transistor M25 is substantially less than the $V_{GS}$ voltage of transistor M26.) Thus, during the shutdown mode, the voltage of conductor 7 is maintained at a value close to the value required to cause bias core circuit 2 to produce the desired value of $V_{BIAS+}$ when disable/enable bias control circuit 1 is in its enabled condition.

When it is desired to switch the bias circuitry M22 and CMOS amplifier 18 to an amplifying condition, shutdown control circuit 15 produces a high value of $V_{SHUTDOWN}$ on conductor 8. This turns transistor M11 off and turns transistor M3 on. The voltage maintained across capacitor C0, i.e., the voltage on conductor 7, then is such that the current through transistors M3, M6 and M1 very rapidly pulls the voltage on conductor 5 down to a level which turns transistors M0 and M41 on and thereby re-establishes the feedback loops mentioned above. That causes bias core circuit 2 to almost immediately produce precisely the desired value of $V_{BIAS+}$ on conductor 5, and therefore also on the gate of the current mirror transistor M22 (and other similar current mirror transistors, not shown) of the bias circuitry that quickly biases CMOS amplifier 18 into its amplifying condition. Optionally, the voltage on conductor 5 also turns off transistors M16 and M17, so that the trickle charging current no longer is produced by transistor M25. In any case, the voltage on conductor 7 is maintained by the normal operation of the two above mentioned negative feedback loops in boost core circuit 2.

The disable/enable bias control circuit 1 of FIG. 1 described above, when in its shutdown condition, can rapidly disable the bias core circuitry 2 and the shutdown the bias circuitry of amplifier 18 in approximately 50 ns, and can then rapidly produce the desired value of $V_{BIAS+}$ on conductor 5 and turn on the bias circuitry M22 to bias up CMOS amplifier 18 in only about 100 to 150 nanoseconds in response to a fast transition of $V_{SHUTDOWN}$ from a low logic level to a high logic level. This is approximately 100 times faster than has been achieved using prior techniques. Thus, the invention provides for enables very fast turn-on for high-speed CMOS operational amplifiers having shutdown control. When integrated circuitry including the disable/enable bias control circuit 1 of FIG. 1 and the high-speed CMOS operational amplifier circuitry and its associated bias circuitry are manufactured using state-of-the-art CMOS manufacturing processes with channel lengths below 0.6 microns, the CMOS operational amplifier circuitry can successively compete with conventional bipolar high-speed operational amplifiers having shutdown control. Thus, the invention provides a fast disable/enable bias control circuit that is very suitable for fast disabling and subsequent fast enabling of the bias circuitry of the various circuits, such as high-speed CMOS operational amplifiers usable in applications such as voltage regulators and video multiplexing, and for providing fast transitions between transmit and receive modes of transceivers. The invention also is suitable for fast enabling of the bias circuitry of bipolar circuits, such as bipolar operational amplifiers.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention. For example, the charging circuit 3 in FIG. 1 and the charging circuits 3 in FIGS. 2–4 could be implemented in a wide variety of ways.

The trickle charging current could be developed across a very high resistance resistor and/or various arrangements of high channel resistance MOS transistors and passed through a threshold circuit that generates a reference voltage approximately equal to the voltage to be maintained across the compensation capacitor. The trickle charging current could be enabled when the disable/enable bias control circuit 1 is disabled, or the trickle charging current could be continuously supplied to compensation capacitor C0, and the feedback loops, when enabled, will generate the correct value of $V_{BIAS+}$. The bias core circuit 2 does not have to be a PTAT circuit or a quasi PTAT circuit, and can be another type of reference circuit.

What is claimed:

1. A disable/enable bias control circuit comprising:
    (a) a reference voltage circuit including an internal feedback loop and a compensation capacitor associated with the feedback loop, the reference voltage circuit being operative, when enabled, to produce a bias voltage having a predetermined value;
    (b) a shutdown circuit coupled to the reference voltage circuit and operative in response to a first level of a control signal to disable the reference voltage circuit and also to disable the feedback loop; and
    (c) a trickle charging circuit coupled to a terminal of the compensation capacitor and operative to produce a trickle charging current into the compensation capacitor to maintain a predetermined voltage across the compensation capacitor, the predetermined voltage permitting the feedback loop to cause the reference voltage circuit to produce the predetermined value of the bias voltage immediately after enabling of the feedback loop and the reference voltage circuit.

2. The disable/enable bias control circuit of claim 1 including a bias circuit transistor having a source coupled to a first supply voltage conductor, a gate coupled to receive the predetermined value of the bias voltage, and a drain supplying a bias current.

3. The disable/enable bias control circuit of claim 1 wherein the shutdown circuit includes a buffer circuit having an input coupled to an input terminal and an output producing the control signal.

4. The disable/enable bias control circuit of claim 3 wherein the shutdown circuit includes a first disable/enable transistor having a source coupled to the first supply voltage conductor, a gate coupled to receive the control signal, and a drain coupled to the first conductor, and a second disable/enable transistor having a drain coupled to control a control transistor of the feedback loop, a gate coupled to receive the control signal, and a source coupled to a second supply voltage conductor.

5. A disable/enable bias control circuit comprising:
    (a) a reference voltage circuit including an internal feedback loop and a compensation capacitor associated with the feedback loop, the reference voltage circuit being operative, when the reference voltage circuit and the feedback loop are enabled, to produce a bias voltage having a predetermined value;
    (b) a shutdown circuit coupled to the reference voltage circuit and operative in response to a first level of a control signal to disable the reference voltage circuit and also to disable the feedback loop; and
    (c) a trickle charging circuit coupled to a terminal of the compensation capacitor and responsive to the first level of the control signal to produce a trickle charging current into the compensation capacitor to maintain a predetermined voltage across the compensation capacitor, the predetermined voltage permitting the feedback loop to cause the reference voltage circuit to produce the predetermined value of the bias voltage immediately after enabling of the feedback loop and the reference voltage circuit.

6. The disable/enable bias control circuit of claim 5 including a bias circuit transistor having a source coupled to a first supply voltage conductor, a gate coupled to receive the predetermined value of the bias voltage, and a drain supplying a bias current.

7. The disable/enable bias control circuit of claim 5 wherein the reference voltage circuit includes a PTAT circuit.

8. The disable/enable bias control circuit of claim 5 wherein the reference voltage circuit includes a quasi PTAT circuit.

9. The disable/enable bias control circuit of claim 5 including a shutdown control circuit which produces the control signal.

10. The disable/enable bias control circuit of claim 9 wherein the shutdown control circuit includes an input terminal and an output that produces the first level of the shutdown signal in response to an external signal applied to the input terminal.

11. The disable/enable bias control circuit of claim 8 wherein the reference voltage circuit includes P-channel first, second and third transistors each having a source coupled to a first supply voltage conductor and a gate coupled to a first conductor on which the bias voltage is produced, and N-channel fourth, fifth, and sixth transistors, the fourth transistor having a drain coupled by the first conductor to the drain and gate of the third transistor, the fifth transistor having a gate and drain coupled to a drain of the first transistor and a gate of the sixth transistor and a source coupled to a second supply voltage conductor, the sixth transistor having a source coupled to the second supply voltage conductor and a drain coupled to a drain of the second transistor, the terminal of the compensation capacitor and a gate of the fourth transistor, the fourth transistor having a source coupled to the shutdown circuit.

12. The disable/enable bias control circuit of claim 11 wherein the shutdown circuit includes a P-channel disable/enable transistor having a source coupled to the first supply voltage conductor, a gate coupled to receive the control signal, and a drain coupled to the first conductor, and an N-channel disable/enable transistor having a drain coupled to the source of the fourth transistor, a gate coupled to receive the control signal, and a source coupled to the second supply voltage conductor.

13. The disable/enable bias control circuit of claim 10 wherein the shutdown circuit includes a Schmitt trigger circuit having an input coupled to the input terminal and an output producing the shutdown signal.

14. The disable/enable bias control circuit of claim 10 wherein the shutdown circuit includes a buffer circuit having an input coupled to the input terminal and an output producing the shutdown signal.

15. The disable/enable bias control circuit of claim 11 wherein the trickle charging circuit includes an N-channel trickle current control transistor having a drain coupled to the first supply voltage conductor and a gate coupled to the first conductor to establish a trickle control current, and a trickle reference voltage circuit coupled to a drain of the trickle current control transistor to produce a trickle reference voltage, and an N-channel trickle current output transistor having a gate coupled to receive the trickle reference voltage, a drain coupled to the first supply voltage conductor, and a source coupled to the terminal of the compensation capacitor.

16. The disable/enable bias control circuit of claim 11 wherein the reference voltage circuit produces another bias voltage having a predetermined value on the drain of the fifth transistor.

17. CMOS operational amplifier circuitry comprising:
    (a) a CMOS operational amplifier including associated bias circuitry;
    (b) a disable/enable bias control circuit including
        i. a reference voltage circuit including an internal feedback loop and a compensation capacitor associated with the feedback loop, the voltage reference circuit being operative, when enabled, to produce a bias voltage having a predetermined value,
        ii. a shutdown circuit coupled to the reference voltage circuit and operative in response to a first level of a control signal to disable the reference voltage circuit and also to disable the feedback loop, and
        iii. a trickle charging circuit coupled to a terminal of the compensation capacitor and operative to produce a trickle charging current into the compensation capacitor to maintain a predetermined voltage across the compensation capacitor, the predetermined voltage permitting the feedback loop to cause the reference voltage circuit to produce the predetermined value of the bias voltage immediately after enabling of the feedback loop and the reference voltage circuit; and
        iv. a shutdown control circuit which produces the control signal, wherein the shutdown control circuit produces the first level of the shutdown signal and the second level of the shutdown signal in response to an external control signal.

18. A method of controlling bias circuitry of an electronic circuit, comprising:
    (a) disabling the bias circuitry by interrupting a compensated feedback loop in a reference voltage circuit that, when enabled, produces a predetermined value of a bias voltage applied to the bias circuitry, and producing a different value of the bias voltage to turn off a bias current produced by the bias circuitry;
    (b) producing a trickle charging current and conducting the trickle charging current into a compensation capacitor of the feedback loop to charge the compensation capacitor to a predetermined voltage which causes the feedback loop and the reference voltage circuit to produce the predetermined value of the bias voltage to cause the bias circuitry to produce the bias current needed for normal operation of the electronic circuit; and
    (c) enabling the bias circuitry of the electronic circuit by enabling the feedback loop and the reference voltage circuit, wherein the compensation capacitor is already precharged to the predetermined voltage and causes the feedback loop and the reference voltage circuit to immediately produce the predetermined value of the bias voltage and to thereby cause the bias circuitry to immediately bias the electronic circuit for normal operation.

19. A method of controlling bias circuitry of an CMOS operational amplifier, comprising:
    (a) disabling the bias circuitry by interrupting a compensated feedback loop in a reference voltage circuit that, when enabled, produces a predetermined value of a bias voltage applied to the bias circuitry, and producing a different value of the bias voltage to turn off a bias current produced by the bias circuitry;
    (b) producing a trickle charging current and conducting the trickle charging current into a compensation capacitor of the feedback loop to charge the compensation capacitor to a predetermined voltage which causes the feedback loop and the reference voltage circuit to produce the predetermined value of the bias voltage to cause the bias circuitry to produce the bias current needed for normal operation of the CMOS operational amplifier; and
    (c) enabling the bias circuitry of the CMOS operational amplifier by enabling the feedback loop and the reference voltage circuit, wherein the compensation capacitor is already precharged to the predetermined voltage and causes the feedback loop and the reference voltage circuit to immediately produce the predetermined value of the bias voltage and to thereby cause the bias circuitry to immediately bias the CMOS operational amplifier for normal operation.

20. The method of claim 19 wherein step (c) includes halting the conducting of the trickle charging current into the compensation capacitor while the bias circuitry of the operational amplifier is enabled.

21. The method of claim 19 wherein the trickle charging current is continuously conducted into the compensation capacitor.

* * * * *